United States Patent
Asenov et al.

(10) Patent No.: US 9,312,362 B2
(45) Date of Patent: Apr. 12, 2016

(54) MANUFACTURE OF A VARIATION RESISTANT METAL-OXIDE-SEMICONDUCTOR FIELD EFFECT TRANSISTOR (MOSFET)

(71) Applicant: Gold Standard Simulations Ltd., Glasgow, Scotland (GB)

(72) Inventors: Asen Asenov, Glasgow (GB); Gareth Roy, Glasgow (GB)

(73) Assignee: SemiWise Limited, Glasgow, Scotland (GB)

( * ) Notice: Subject to any disclaimer, the term of this patent is extended or adjusted under 35 U.S.C. 154(b) by 0 days.

(21) Appl. No.: 14/664,595

(22) Filed: Mar. 20, 2015

(65) Prior Publication Data
US 2015/0194505 A1 Jul. 9, 2015

Related U.S. Application Data

(62) Division of application No. 13/424,727, filed on Mar. 20, 2012, now Pat. No. 8,994,123.

(60) Provisional application No. 61/568,523, filed on Dec. 8, 2011, provisional application No. 61/526,033, filed on Aug. 22, 2011.

(51) Int. Cl.
*H01L 21/336* (2006.01)
*H01L 29/66* (2006.01)
(Continued)

(52) U.S. Cl.
CPC ...... *H01L 29/66651* (2013.01); *H01L 21/0262* (2013.01); *H01L 21/02164* (2013.01);
(Continued)

(58) Field of Classification Search
CPC ............ H01L 51/5016; H01L 51/0067; H01L 51/0072; H01L 51/0036; C09K 11/06
USPC ........................... 438/216, 287, 591; 257/411
See application file for complete search history.

(56) References Cited

U.S. PATENT DOCUMENTS 5,298,452 A 3/1994 Meyerson
5,314,547 A 5/1994 Heremans et al.
(Continued)

FOREIGN PATENT DOCUMENTS

| EP | 0936676 | 8/1999 |
|---|---|---|
| WO | WO-2009/053327 | 4/2009 |
| WO | WO-2013/027092 | 2/2013 |

OTHER PUBLICATIONS

"International Search Report and Written Opinion of the International Searching Authority Dated Nov. 9, 2012, International Application No. PCT/IB2012/001068", (Nov. 9, 2012).
(Continued)

*Primary Examiner* — Andy Huynh
(74) *Attorney, Agent, or Firm* — Blakely Sokoloff Taylor & Zafman LLP

(57) ABSTRACT

Variation resistant metal-oxide-semiconductor field effect transistors (MOSFETs) are manufactured using a high-K, metal-gate 'channel-last' process. A cavity is formed between spacers formed over a well area having separate drain and source areas, and then a recess into the well area is formed. The active region is formed in the recess, comprising an optional narrow highly doped layer, essentially a buried epitaxial layer, over which a second un-doped or lightly doped layer is formed which is a channel epitaxial layer. The high doping beneath the low doped epitaxial layer can be achieved utilizing low-temperature epitaxial growth with single or multiple delta doping, or slab doping. A high-K dielectric stack is formed over the channel epitaxial layer, over which a metal gate is formed within the cavity boundaries. In one embodiment of the invention a cap of poly-silicon or amorphous silicon is added on top of the metal gate.

25 Claims, 10 Drawing Sheets

(51) Int. Cl.

| | | |
|---|---|---|
| *H01L 29/51* | (2006.01) | |
| *H01L 29/78* | (2006.01) | |
| *H01L 29/10* | (2006.01) | |
| *H01L 21/02* | (2006.01) | |
| *H01L 21/306* | (2006.01) | |
| *H01L 21/3105* | (2006.01) | |
| *H01L 21/311* | (2006.01) | |
| *H01L 21/8234* | (2006.01) | |
| *H01L 29/36* | (2006.01) | |

(52) U.S. Cl.
CPC .... *H01L21/02631* (2013.01); *H01L 21/02636* (2013.01); *H01L 21/30604* (2013.01); *H01L 21/31053* (2013.01); *H01L 21/31111* (2013.01); *H01L 21/823437* (2013.01); *H01L 29/105* (2013.01); *H01L 29/365* (2013.01); *H01L 29/517* (2013.01); *H01L 29/6656* (2013.01); *H01L 29/6659* (2013.01); *H01L 29/66545* (2013.01); *H01L 29/7833* (2013.01); *H01L 29/665* (2013.01)

(56) References Cited

U.S. PATENT DOCUMENTS

| | | | |
|---|---|---|---|
| 5,316,958 | A | 5/1994 | Meyerson |
| 6,180,978 | B1 | 1/2001 | Chatterjee et al. |
| 6,479,866 | B1 | 11/2002 | Xiang |
| 6,566,734 | B2 | 5/2003 | Sugihara et al. |
| 6,627,488 | B2 | 9/2003 | Lee |
| 6,630,710 | B1 | 10/2003 | Augusto |
| 6,667,200 | B2 | 12/2003 | Sohn et al. |
| 6,812,157 | B1 | 11/2004 | Gadgil |
| 7,023,068 | B1 | 4/2006 | Hopper et al. |
| 7,045,407 | B2 | 5/2006 | Keating et al. |
| 7,459,752 | B2 | 12/2008 | Doris et al. |
| 7,589,347 | B2 | 9/2009 | Nash et al. |
| 7,906,413 | B2 | 3/2011 | Cardone et al. |
| 8,273,617 | B2 | 9/2012 | Thompson et al. |
| 8,748,986 | B1 | 6/2014 | Shifren et al. |
| 2001/0009292 | A1 | 7/2001 | Nishinohara et al. |
| 2002/0001930 | A1 | 1/2002 | Lee |
| 2002/0029372 | A1 | 3/2002 | Lee |
| 2002/0037619 | A1 | 3/2002 | Sugihara et al. |
| 2003/0211681 | A1 | 11/2003 | Hanafi et al. |
| 2004/0201063 | A1 | 10/2004 | Fukuda |
| 2004/0206980 | A1 | 10/2004 | Cheong et al. |
| 2006/0022270 | A1 | 2/2006 | Boyd et al. |
| 2006/0046399 | A1 | 3/2006 | Lindert et al. |
| 2006/0113605 | A1 | 6/2006 | Currie |
| 2008/0001237 | A1 | 1/2008 | Chang et al. |
| 2008/0017887 | A1 | 1/2008 | Nagata et al. |
| 2009/0321820 | A1 | 12/2009 | Yamakawa |
| 2009/0321849 | A1 | 12/2009 | Miyamura et al. |
| 2010/0237433 | A1 | 9/2010 | Zampardi et al. |
| 2011/0073961 | A1 | 3/2011 | Dennard et al. |
| 2011/0074498 | A1 | 3/2011 | Thompson et al. |
| 2011/0212583 | A1 | 9/2011 | Neudeck |
| 2011/0260220 | A1 | 10/2011 | Chi et al. |
| 2013/0001706 | A1 | 1/2013 | Haran et al. |

OTHER PUBLICATIONS

"International Search Report and Written Opinion of the International Searching Authority Dated Nov. 9, 2012, International Application No. PCT/IB2012/001069", (Nov. 9, 2012).
"International Search Report and Written Opinion of the International Searching Authority Dated Nov. 13, 2013, International Application No. PCT/IB2013/001637", (Nov. 13, 2013).
"Notice of Allowance Dated Dec. 19, 2014; U.S. Appl. No. 14/323,177", (Dec. 19, 2014).
"Notice of Allowance Dated Nov. 14, 2014; U.S. Appl. No. 13/424,727", (Nov. 14, 2014).
"Office Action Dated Aug. 13, 2013; U.S. Appl. No. 13/424,745", (Aug. 13, 2013).
"Office Action Dated Jul. 7, 2014; U.S. Appl. No. 13/424,745", (Jul. 7, 2014).
"Office Action Dated Jul. 7, 2014; U.S. Appl. No. 13/950,834", (Jul. 7, 2014).
"Office Action Dated Jul. 8, 2014; U.S. Appl. No. 13/950,810", (Jul. 8, 2014).
"Office Action Dated Jul. 8, 2014; U.S. Appl. No. 13/950,868", (Jul. 8, 2014).
"Office Action Dated May 7, 2014; U.S. Appl. No. 13/424,727", (May 7, 2014).
"Office Action Dated Nov. 22, 2013; U.S. Appl. No. 13/424,727", (Nov. 22, 2013).
"Office Action Dated Oct. 24, 2013; U.S. Appl. No. 13/424,745", (Oct. 24, 2013).
"Office Action Dated Oct. 24, 2014; U.S. Appl. No. 13/950,868", (Oct. 24, 2014).
"Office Action Dated Oct. 27, 2014; U.S. Appl. No. 13/950,834", (Oct. 27, 2014).
"Office Action Dated Oct. 3, 2014; U.S. Appl. No. 13/950,810", (Oct. 3, 2014).
Asenov, Asen, "Random Dopant Induced Threshold Voltage Lowering and Fluctuations in Sub-0.1 µm MOSFET's: A 3-D 'Atomistic' Simulation Study", *IEEE Transactions on Electron Devices*, vol. 45, No. 12, (Dec. 1998), pp. 2505-2513.
Asenov, Asen, "Random Dopant Threshold Voltage Fluctuations in 50nm Epitaxial Channel MOSFETs: A 3D 'Atomistic' Simulation Study", *ESSDERC '98: 28th Conference on European Solid-State Devices*, Bordeaux, France, (Sep. 8-10 1998), pp. 300-303.
Asenov, Asen, et al., "Suppression of Random Dopant-Induced Threshold Voltage Fluctuations in Sub-0.1-µm MOSFET's with Epitaxial and δ-Doped Channels", *IEEE Transactions on Electron Devices*, vol. 46, No. 8, (Aug. 1999), pp. 1718-1724.
Bruel, M., "Silicon on insulator material technology", *Electronics Letters*, vol. 31, No. 14, (Jul. 6, 1995), pp. 1201-1202.
Colinge, Jean-Pierre, "Hot-Electron Effects in Silicon-on-Insulator n-Channel MOSFET's", *IEEE Transactions on Electron Devices*, vol. ED-34, No. 10, (Oct. 1987), pp. 2173-2177.
Courtland, Rachel, "Start-up Seeks New Life for Planar Transistors, SuVolta is pursuing precision doping in its bid to compete with 3-D transistor technology", *ieee spectrum tech alert*, (Dec. 8, 2011), 3 pp. total.
Frank, Martin M., "High-k / Metal Gate Innovations Enabling Continued CMOS Scaling", *2011 Proceedings of the ESSCIRC*, (Sep. 12-16, 2011), pp. 50-58.
Fu, Y., et al., "Subband structure and ionized impurituy scattering of the two dimensional electron gas in δdoped field effect transistor", *Journal of Applied Physics*, vol. 78, No. 5, (Sep. 1, 1995), pp. 3504-3510.
Fujita, K., et al., "Advanced Channel Engineering Achieving Aggressive Reduction of VT Variation for Ultra-Low-Power Applications", *Electron Devices Meeting (IEDM)*, (Dec. 2011), pp. 32.3.1-32.3.4.
Hokazono, Akira, et al., "25-nm Gate Length nMOSFET With Steep Channel Profiles Utilizing Carbon-Doped Silicon Layers (A P-Type Dopants Confinement Layer)", *IEEE Transactions on Electron Devices*, vol. 58, No. 5, (May 2011), pp. 1302-1310.
Kuhn, Kelin J., et al., "Process Technology Variation", *IEEE Transactions on Election Devices*, vol. 58, No. 8, (Aug. 2011), pp. 2197-2208.
Maleville, Christophe, "Extending planar device roadmap beyond node 20nm through ultra thin body technology", *2011 International Symposium on VLSI Technology, Systems and Applications (VLSI-TSA)*, (Apr. 25-27, 2011), pp. 1-4.
Markov, Stanislov, et al., "Statistical Variability in Fully Depleted SOI MOSFETs Due to Random Dopant Fluctuations in the Source and Drain Extensions", *IEEE Electron Device Letters*, vol. 33, No. 3, (Mar. 2012), pp. 315-317.
Meyer, J. E., et al., "High Performance, Low Power CMOS Memories Using Silicon-On-Sapphire Technology", *1971 International Electron Devices Meeting*, (1971), p. 44.

(56) References Cited

OTHER PUBLICATIONS

Noda, Kenji, et al., "A 0.1-μm Delta-Doped MOSFET Fabricated with Post-Low-Energy Implanting Selective Epitaxy", *IEEE Transactions on Electron Devices*, vol. 45, No. 4, (Apr. 1998), pp. 809-813.

Pawlak, B. J., et al., "Effect of amorphization and carbon co-doping on activation and diffusion of boron in silicon", *Applied Physics Letters*, 89, 062110, (2006), pp. 062110-1 to 062110-3.

Pawlak, B. J., et al., "Suppression of phosphorus diffusion by carbon co-implantation", *Applied Physics Letters*, 89, 062102, (2006), pp. 062102-1 to 062102-3.

Roy, G., et al., "Random dopant fluctuation resistant 'bulk' MOSFETs with epitaxial delta doped channels", *Ultimate Integration in Silicon (ULIS) Conference*, Glasgow, Scotland (2007), 4 pp. total.

Takeuchi, Kiyoshi, et al., "Channel Engineering for the Reduction of Random-Dopant-Placement-Induced Threshold Voltage Fluctuation", *1997 International Electron Devices Meeting (IEDM)*, Technical Digest, (Dec. 7-10, 1997), pp. 841-844.

"Notice of Allowance Dated Oct. 5, 2015; U.S. Appl. No. 13/950,810", (Oct. 5, 2015).

"Notice of Allowance Dated Oct. 8, 2015; U.S. Appl. No. 13/950,868", (Oct. 8, 2015).

"Notice of Allowance Dated Jul. 7, 2015; U.S. Appl. No. 13/950,834", (Jul. 7, 2015).

"Office Action Dated Jul. 1, 2015; U.S. Appl. No. 13/950,868", (Jul. 1, 2015).

"Office Action Dated May 15, 2015; U.S. Appl. No. 13/950,810", (May 15, 2015).

"Office Action Dated Aug. 25, 2015; U.S. Appl. No. 13/424,745", (Aug. 25, 2015).

MANUFACTURE OF A VARIATION RESISTANT METAL-OXIDE-SEMICONDUCTOR FIELD EFFECT TRANSISTOR (MOSFET)

CROSS-REFERENCE TO RELATED APPLICATIONS

This application is a divisional of U.S. patent application Ser. No. 13/424,727 filed Mar. 20, 2012 which claims the benefit of U.S. Provisional Patent Application No. 61/526,033 filed Aug. 22, 2011 and U.S. Provisional Patent Application No. 61/568,523 filed Dec. 8, 2011.

BACKGROUND OF THE INVENTION

1. Field of the Invention

The present invention generally relates to the manufacturing of metal-oxide-semiconductor field effect transistors (MOSFETs), and more particularly to MOSFETs manufactured for reproducibility of threshold voltages among otherwise identical transistors.

2. Prior Art

Random variation in threshold voltage ($\sigma V_T$) of metal-oxide semiconductor (MOS) field effect transistors (MOSFETs) with high-K (high dielectric constant) metal gate stack is caused by some dominant factors: (i) random dopant fluctuations (RDF) in the well and in the pocket implant regions underneath the gate, which, among other things, cause variations in depletion layer thickness; (ii) line edge roughness (LER) which causes random variation in the length of the gate electrode resulting from random variations in profile of the etched gate; and, (iii) metal gate granularity (MGG) which causes random variations in the local work function due to the grain structure of the gate material. There is a fourth source of variation, the random variations in the effective channel length, referred to as random extension fluctuations (RXF), arising from statistical variations in the position of the junction that separates the channel from either the source or the drain extensions. However, as MOSFETs become smaller, the effects of RDF, LER, and RXF increase and become major factors in determining $\sigma V_T$. The first effect, RDF, has recently gained intense attention. The randomness in the position of the drain extension RXF has two principal sources: a) variations in the final position of implanted ions due to scattering; and, b) variations in the activation and positions of the source/drain extension ions as influenced by the activation and subsequent heat treatments.

It is well-known in the art that as MOSFETs move to finer and finer dimensions, variability of the threshold voltage $\sigma V_T$ seriously undermines the reproducibility of threshold voltages among otherwise identical transistors. This effect is inevitable, and it is particularly severe in its impact on complimentary MOS (CMOS) static random access memories (SRAM), which use millions of near-minimum sized transistors. Development of ultra-thin silicon on insulator (SOI) structures, e.g., fully depleted SOI (FDSOI), and of three-dimensional transistors (FinFET and Tri-Gate), are largely motivated by a need to reduce the threshold spreads $\sigma V_T$ caused by RDF. This trend moves away from the more traditional bulk MOS manufacturing, adversely impacting costs and availability. A cross-section 400 of a standard bulk MOSFET, formed in a gate-last process, is shown in FIG. 4. On bulk 410 of one conductivity type, drain and source areas 420 of an opposite conductivity type are formed. A SiO$_2$ isolation layer 430 is formed over the entire MOSFET transistor, with openings for connections 470 to respective drain and source terminals. In the gate-last process of the MOSFET, the gate is formed by having spacers 440 formed above the SiO$_2$ layer. The SiO$_2$ is removed and typically replaced by a high-K dielectric stack 450 on top of which a metal gate 460 is formed. In certain embodiments the spacers are formed by repeating the deposition-and-etch process.

One method of addressing the RDF problem was described by Asenov et al. in the paper "Suppression of Random Dopant-Induced Threshold Voltage Fluctuations in Sub-0.1-μm MOSFETs with Epitaxial and δ-Doped Channels," IEEE Transactions on Electron Devices, Vol. 46, No. 8, August 1999, Pages 1718-1724. This approach is consistent with bulk transistors, and does not have the same cost penalties associated with FinFETs and FDSOI. This scheme has three key components: a) placing a thin, approximately 10 nanometer (nm), minimally doped epitaxial layer immediately beneath the gate oxide; b) placing a thinner layer with a very high concentration of either acceptors for an NMOS device or donors for a PMOS device at the boundary of the thin epitaxial layer that is remote from the gate dielectric interface; and, c) incorporating a moderately heavily doped well layer beneath the un-doped epitaxial layer and the highly doped, thinner layer. Similar structures have been demonstrated by Fujita et al. as described in their paper "Advanced Channel Engineering Achieving Aggressive Reduction of $V_T$ Variation for Ultra-Low-Power Applications", Electron Devices Meeting (IEDM), 2011 IEEE International, pp. 32.3.1-32.3.4, 5-7 Dec. 2011. A cross-section 500 of such an epitaxial transistor is shown in FIG. 5. The epitaxial layer 510 is deposited on the whole silicon wafer after the channel doping implantation through a sacrificial gate oxide and before the formation of the sacrificial polysilicon gate and the source drain regions 525. In some instances, for example, Hokazono, A., et al., in "25-nm Gate Length nMOSFET With Steep Channel Profiles Utilizing Carbon-Doped Silicon Layers (A P-Type Dopant Confinement Layer)", Electron Devices, IEEE Transactions on Electron Devices, vol. 58, no. 5, pp. 1302-1310, May 2011, carbon is introduced before the epitaxy to retard the diffusion of doping into the low-doped epitaxial region during the source/drain implantation activation. However, this is an exceedingly difficult task and experimentation has shown that the profiles degrade due to subsequent processing steps, resulting in doping penetration into the low-doped epitaxial layer.

Roy, et al. in "Random Dopant Fluctuation Resistant 'Bulk' MOSFETs with Epitaxial Delta Doped Channels," Ultimate Integration in Silicon (ULIS) Conference, Glasgow, Scotland, 2007, further amplified these concepts when addressing a thin epitaxial layer, plus 6-layer in the context of a known 45 nm CMOS technology, having a gate length of 35 nm. In each case the critical δ-layer doping was simulated as if it had a depth distribution of a Dirac delta function, i.e., the doping ions are distributed in a differentially thin layer. In all cases, substantial reductions in the statistical variations in threshold voltage $\sigma V_T$ due to RDF were realized. The delta doping layer, in these simulations, is mostly depleted, and that layer provides the tool for adjusting the nominal value of the threshold voltage. However, high temperature processing would substantially alter the doping profiles, compromising the expected benefits. This problem persists even though it is well known that certain complementary dopants, like carbon, can retard motion during thermal treatments, at least in n-channel devices.

Recent changes to gate architectures from poly-silicon over silicon dioxide or oxynitride, to metal over high-K gate dielectric stack have changed the processing sequence. (A high-K or high dielectric constant as used herein and in the claims to follow means a dielectric constant that is higher than the dielectric constant of silicon dioxide (K=3.9); an effective dielectric constant K exceeding 6 would be a preferred high-K dielectric.) This is particularly true for the "gate last" process flow. In this process, while there is seemingly a complete transistor, with oxide and/or nitride sidewall spacers on each side of a poly gate, the gate is actually a sacrificial structure. That gate structure and the underlying protective oxide are etched away, exposing the silicon surface. Then a sequence of steps is employed: a) deposition of a high-K gate dielectric, typically by atomic layer deposition; b) deposition of a metal gate having a controlled work function to set the threshold voltage; and, c) deposition of a robust gate material, typically doped amorphous silicon. In many cases the sequence above is augmented by chemical-mechanical polishing steps to assure the localization of the various layers. However, this structure does not overcome the deficiencies resulting from RDF, LER or RXF. The morphology of the metal in the gate last process does reduce the variations identified as MGG, compared to a gate first process.

It would therefore be advantageous to find a solution compatible with bulk MOS manufacturing that would overcome deficiencies resulting from RDF, RXF and LER while generally maintaining the cost advantages and relative simplicity of standard bulk MOS manufacturing. It would be further advantageous if reductions of RDF, RXF, and LER are achieved simultaneously.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION OF THE PREFERRED EMBODIMENTS

Variation resistant metal-oxide-semiconductor field effect transistors (MOSFETs) are manufactured using a high-K, metal, 'channel-last' process. Between spacers formed over a well area having separate drain and source areas, a cavity and then a recess into the well area are formed. The active region is formed on top of an optional thin highly doped layer over which an un-doped or lightly doped epitaxial layer is formed. The high doping beneath the low doped epitaxial layer can be achieved utilizing low-temperature epitaxial growth (not to exceed 750° C. but preferably not exceeding 650° C.) with single or multiple delta doping, or slab doping. This epitaxial growth may be effected using conventional low-temperature epitaxy, molecular beam epitaxy or atomic layer deposition. A high-K dielectric stack is formed over the upper or epitaxial layer over which a metal gate is formed within the cavity boundaries. In one embodiment of the invention a cap of poly-silicon or amorphous silicon is added on top of the metal gate.

According to the principles of the invention, incorporation into the manufacturing process a step of a very lightly doped, low temperature (such as 750° C. or lower, preferably not exceeding 650° C.) epitaxial layer within a cavity formed for the purpose of creation of a channel of a MOSFET that results in a "channel-last" process, reduces the diffusion of dopants from the heavily doped region beneath the low-doped epitaxial layer (or from the well if such a heavily doped region is not used) into the low-doped epitaxial layer. The low-doped epitaxial layer reduces the variations in the MOSFETs' threshold voltage arising from random doping fluctuations (RDF). The epitaxial growth retains the strain introduced or memorized in the transistor structure in order to enhance device performance. The etching through the opening of the sacrificial poly-silicon gate reduces the random channel length fluctuations that arise from variations in the lateral position of the edge of the drain and source extension implants, i.e., random extension fluctuations (RXF). The addition of the optional layer of increased doping beneath the low doped epitaxial layer reduces the short channel effects and the threshold voltage fluctuations related to line edge roughness (LER). It also offers a method of adjusting the threshold voltage to a desired value. In the descriptive paragraphs below, the use of a heavily doped first layer, typically an epitaxial layer will be assumed, even though it is optional with regard to this invention.

Figure 1:
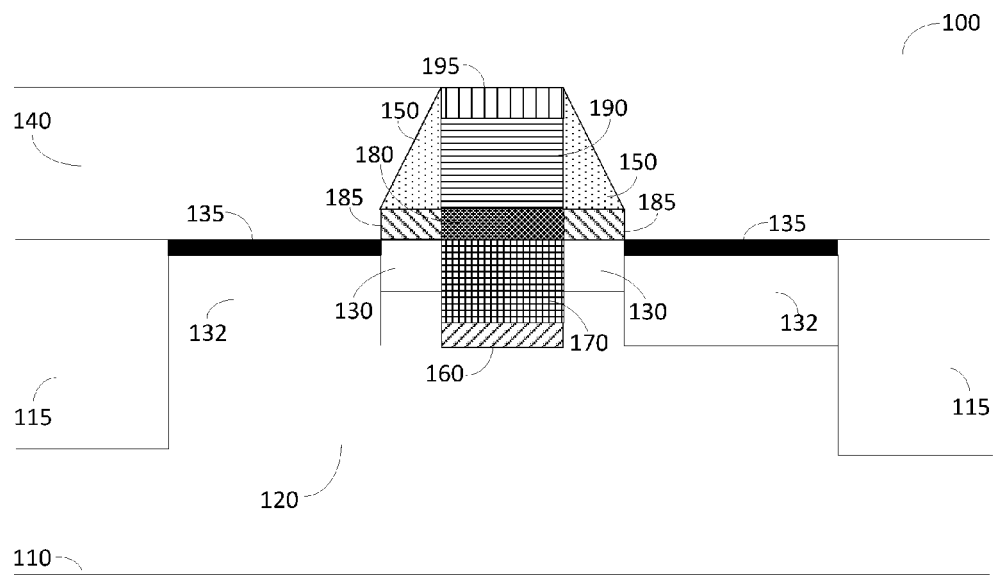
FIG. 1 is a schematic cross-section of a MOSFET manufactured in accordance with the principles of the invention.

Reference is now made to FIG. 1 that depicts an exemplary and non-limiting schematic cross-section of a MOSFET 100 manufactured in accordance with the principles of the invention. A well 120 is manufactured in a substrate 110, for example a silicon wafer, the well made of silicon or silicon-germanium, and typically doped to $10^{18}$ to $10^{19}$ ions per cm$^3$. The well may be a P-well or an N-well depending on the desired transistor type, N-channel or P-channel respectively. A silicon-oxide (SiO$_2$) or nitrided silicon dioxide layer 185 provides isolation in surface areas as required for proper operation of the MOSFET 100. Within the well area there are formed source and drain areas that are a combination of a low-doping area 130 and a high-doping area 132, each such source and drain area being separated from the other by a sacrificial polysilicon gate 195, though with some diffusion to extend each region slightly under the sacrificial polysilicon gate 195. Each highly doped area 132 has a silicide area 135, used to electrically connect to the source and drain of the formed MOSFET and to reduce the access resistance. Spacers 150, formed in a conventional manner over the low-doped source or drain area 130, are used to define the gate region of the MOSFET, in a process that resembles a conventional MOS or 'gate-last' process and as described herein below in greater detail. In certain embodiments, spacers may be formed in two steps, as is known to those skilled in the art. A shallow trench 115 separates adjacent transistors.

Within the cavity confined by the spacers 150, a recess is formed into the well 120 and a new active region is formed therein, and then completed consistent with the 'gate-last' manufacturing approach. The final transistor structure is formed from several layers, the structure of which is unique to the invention. The processing sequence minimizes the thermal exposure of the very steep diffusion gradients implicit in this structure, ensures the low doping concentration in the epitaxial layer, and increases reproducibility of threshold voltages among otherwise identical transistors. In this embodiment, the active channel is comprised of an optional first highly doped layer 160 such as a highly doped epitaxial δ-layer, and a channel epitaxial layer 170 that is either un-doped or lightly doped. The undoped or lightly doped epitaxial layer has a doping density typically in the range of zero to $10^{17}$ ions/cm$^3$. The first layer is typically doped in the range of $10^{12}$ to $10^{14}$ ions/cm$^2$. An area density is used in this case due to the fact that this first layer 160 is very thin, and at the extreme, a monolayer. The thickness of the first layer 160 is typically between 0.3 nm and 15 nm while the epitaxial layer 170 has a thickness of 1 nm to 25 nm. Over the epitaxial layer 170 a high-K dielectric stack 180 is formed having a typical effective oxide thickness ranging between 0.5 nm and 3 nm. On top of the high-K dielectric stack 180 a metal gate 190 is formed having a typical thickness of 40 to 200 nm. In one embodiment of the invention a polysilicon cap 195 is added as a layer on top of the metal gate 190. A dielectric layer 140 is further used as part of this structure. It should be therefore understood that the invention covers, without limitation, both a full MOSFET structure 100 as described hereinabove as well as a channel region of a MOSFET that is comprised of the layers 160 (optional), 170, 180 and 190 and optionally layer 195. Incorporation of the two recessed layers 160 and particularly epitaxial layer 170 into a 'gate-last' structure minimizes the thermal exposure of the very steep diffusion gradients implicit to this structure and hence increases reproducibility of threshold voltages among otherwise identical transistors. It should therefore be understood that the incorporation of layers 160 and 170 results in a "channel-last" MOSFET architecture that provides the benefits discussed herein over the prior art "gate-last" MOSFET architecture.

Figure 2A:
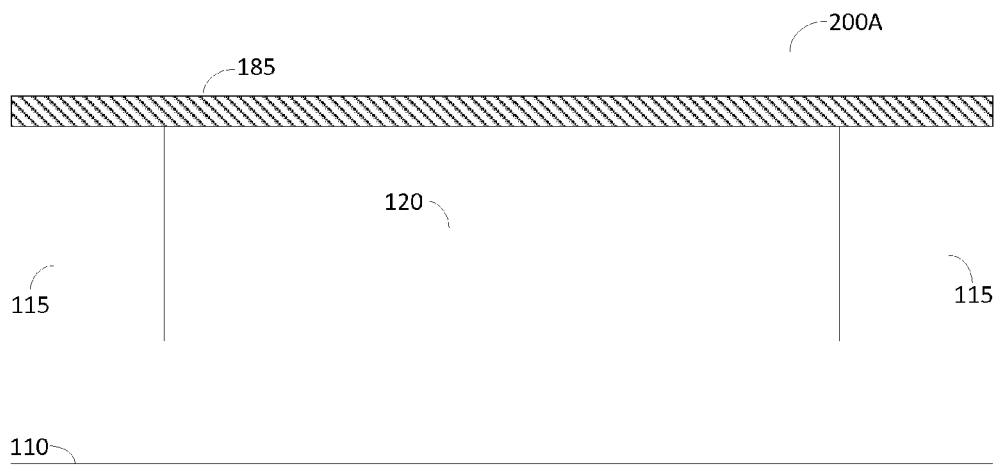
FIG. 2A is a schematic cross-section showing a substrate with shallow trench isolation and a properly implanted core well according to an embodiment of the invention.
Figure 2B:
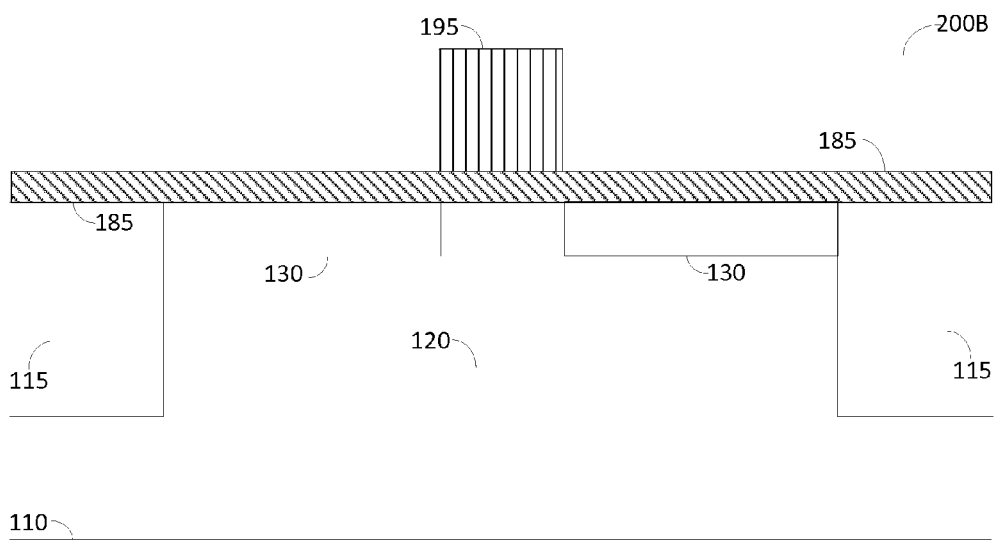
FIG. 2B is a schematic cross-section showing a poly gate and drain/source implants according to an embodiment of the invention.

FIGS. 2A through 2K demonstrate schematically the exemplary and non-limiting processing steps taken in order to achieve the 'channel-last' MOSFET with a channel comprising the two layers of different materials, one or both of which may be epitaxial layers. In the typical, but probably not the only case, these materials are both silicon, differing only in their doping densities. FIG. 2A shows a cross-section 200A where a substrate 110 is prepared by creating shallow trench isolation 115 and implanting an appropriate well 120 for a desired transistor. A SiO$_2$ or a nitrided SiO$_2$ layer 185 is formed over the entire surface, or in other embodiments on portions thereof, for at least electrical isolation purposes. Such a layer 185 could be of a typical thickness of 3.5 nm that may range between 2 nm and 8 nm, but not limited thereto. In FIG. 2B, cross-section 200B, the formation of a sacrificial poly gate 195 is shown, using appropriate manufacturing masks, for example by deposition and directional etching. Drain and source extension areas 130 are also formed by implantation through the SiO$_2$ layer 185, as well as any other pocket implants (not shown) if and when necessary and/or applicable.

Figure 2C:
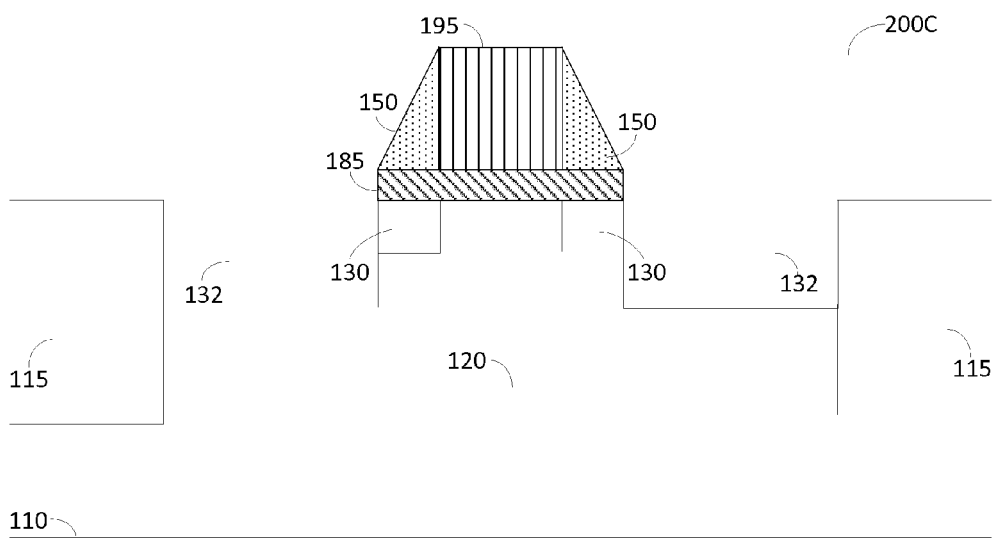
FIG. 2C is a schematic cross-section showing poly gate spacers, drain/source extension regions and heavy drain/source implants according to an embodiment of the invention.
Figure 2D:
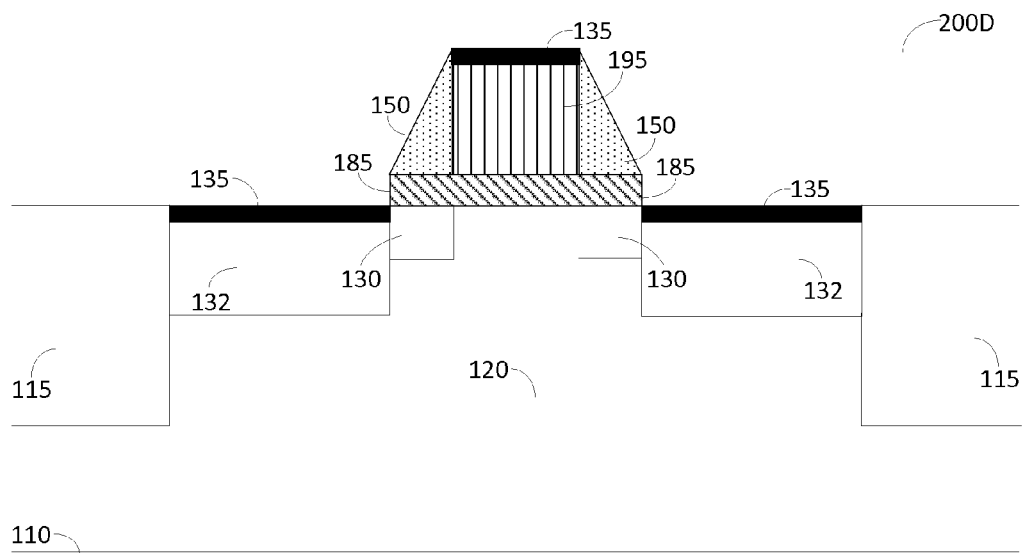
FIG. 2D is a schematic cross-section showing poly gate and drain/source silicidation according to an embodiment of the invention.
Figure 2E:
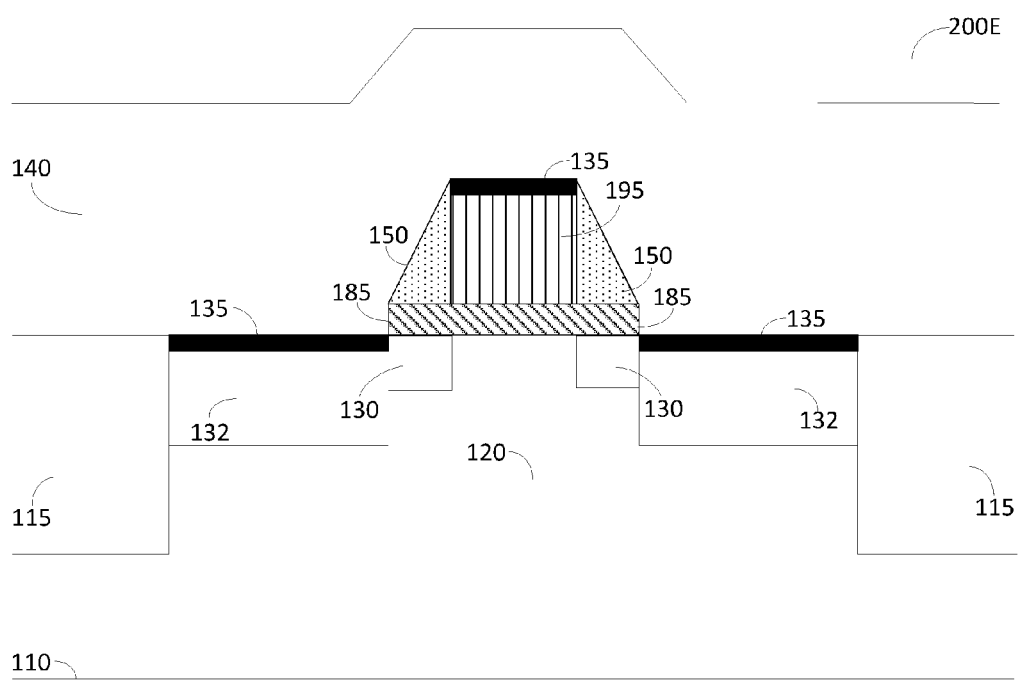
FIG. 2E is a schematic cross-section showing deposition of a first interlayer dielectric according to an embodiment of the invention.
Figure 2F:
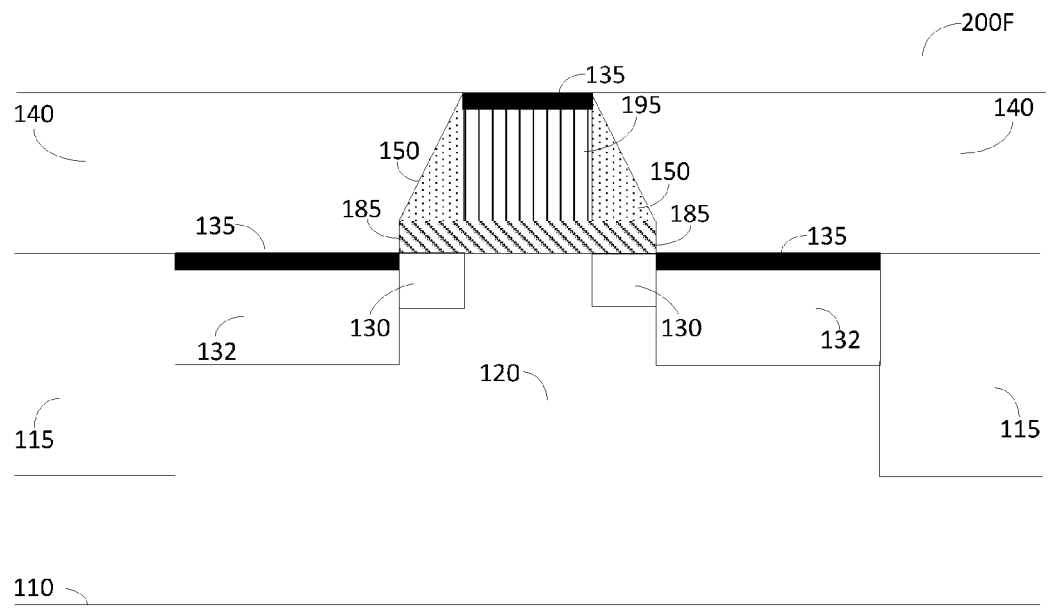
FIG. 2F is a schematic cross-section showing exposed poly gate after chemical/mechanical polish (CMP) according to an embodiment of the invention.

In FIG. 2C the cross-section 200C shows the spacers 150 that are created by deposition of nitride or a combination of nitride and oxide. Then anisotropic etching with vertical or tapered impact takes place. This selectively erodes the deposited sidewall material so the regions paralleling the wafer surface are removed, but vertical or tapered sections remain. In certain embodiments, the spacer is formed by repeating the deposition-and-etch process. After first deposition-and-etch step, the shallow drain/source extensions are formed by ion implantation, plasma immersion doping or a suitable process. Then, another deposition and etch step is carried out to space the drain/source from the channel. After that, the heavily doped source and drain areas 132 can be implanted, typically using the spacers 150 as masks. In some cases (not shown), additional silicon or silicon/germanium may be deposited to elevate the top of the source and drain regions above the original silicon surface and to insert compressive strain in the p-channel MOSFET. Silicon/Germanium (Si:Ge) or Silicon/Carbon (Si:C) stressors, in some cases with a E shape, can also be embedded by partial etching of the source and drain regions and epitaxial regrowth of the stressors. In FIG. 2D the cross-section 200D shows the clearing of certain areas of the SiO$_2$ layer 185 to expose for example the drain and source areas 132. It should be noted that the anisotropic etch that forms the spacers 150 may also clear the protective oxide 185. Then a siliciding material is deposited to form a silicide layer 135 in the drain, source and poly areas. Silicidation material may include, but is not limited to nickel, platinum or palladium, which reacts with the intended areas to form a conductive silicide on the gate 195 and the source and the drain areas 132. FIG. 2E shows a cross-section 200E where a first interlayer dielectric 140 is deposited where in FIG. 2F the cross-section 200F shows the result after chemical/mechanical polishing (CMP) of the first interlayer dielectric 140 up to the silicidation layer 135 of the poly gate 195. It should be noted that the silicide layer 135 on the poly gate 195 may or may not be lost by this step. In that regard, it should be noted that all values and ranges provided herein are exemplary only, and should not be considered as limiting the scope of the invention.

Figure 2G:
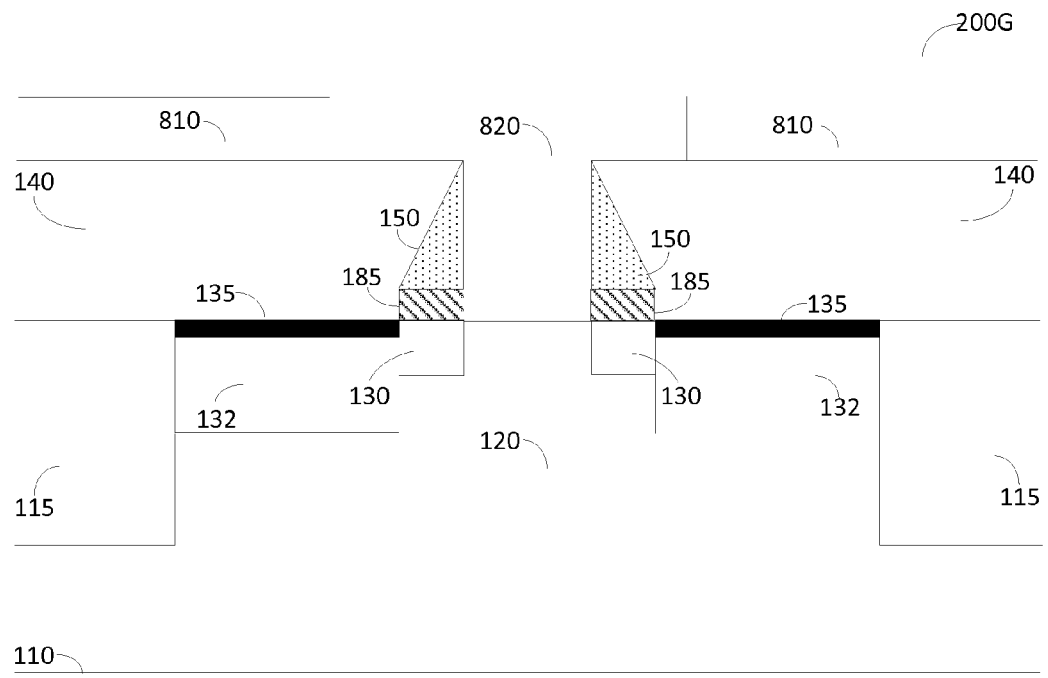
FIG. 2G is a schematic cross-section showing a cavity formed by sacrificing the poly gate according to an embodiment of the invention.

At this point of the process the gates that are to be manufactured using a 'channel-last' process are formed. This is achieved by first coating the area with a protective photoresist 810, and patterning the photoresist as shown in cross-section 200G of FIG. 2G. After patterning, the photoresist protects other devices that are not to be etched. Next, a self-aligned etching process is selected for its selectivity for the sacrificial gate material and its propensity not to etch the spacers 150 and other oxides in any significant manner (FIG. 2G). Then, a cavity 820 is formed in the area confined between the spacers 150 and which is not protected by the protective photoresist layer 810. Any remaining poly gate 195 is etched off as well as the $SiO_2$ layer 185 that is within the cavity 820.

Figure 2H:
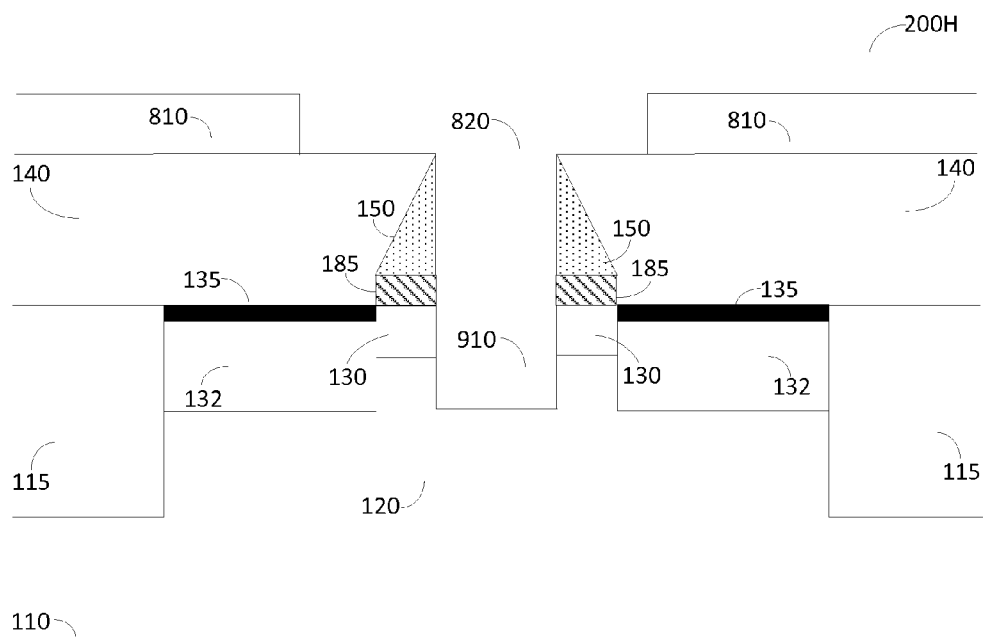
FIG. 2H is a schematic cross-section showing a recess formed into the well from within the cavity according to an embodiment of the invention.
Figure 2I:
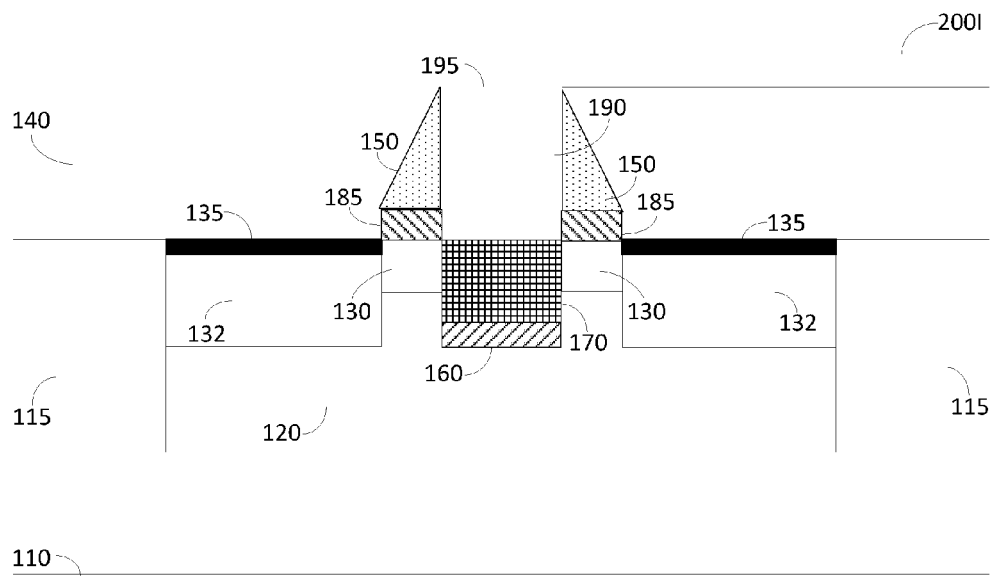
FIG. 2I is a schematic cross-section showing a first layer and a second layer formed within the recess according to an embodiment of the invention.

FIG. 2H shows a cross-section 200H depicting a processing step where, while maintaining the protective photoresist layer 810, a recess 910 is formed from within the cavity 820 into the well 120. A self-aligned, selective etch process (preferably a directional etch) may be used to create a 5 to 25 nm recess into the silicon. According to the invention, and as further shown in FIG. 2I, cross-section 200I, an optional delta epitaxial layer 160 is grown in the recess 910 over which a lightly doped or un-doped epitaxial layer 170 is grown. The epitaxial layer 160 may be referred to as a buried epitaxial layer and the epitaxial layer 170 may be referred to as the channel epitaxial layer. Generally the buried epitaxial layer and the channel epitaxial layer will be of the same conductivity type as the well. The channel epitaxial layer 170 may be formed of silicon, but in certain instances it may be advantageous to grow the low-doped layer using some combination of silicon and germanium, or an alternate semiconducting material that is compatible with the underlying substrate. The thickness of the epitaxial layer 170 is controlled such that the top surface of layer 170 is preferably, but not exclusively, in line with the silicon surface under the layer 185, although the surface of layer 170 may be slightly recessed with respect to the lower level of spacer 185. As shown in FIG. 2I, the lower surface of layer 185 coincides with the upper level of layer 170. The doping density of the delta layer 160 is chosen in combination with the un-doped epitaxial layer 170 thickness, the high-K gate stack thickness and the metal gate work function subsequently created to define the final, desired threshold voltage. These operations may be performed using atomic layer deposition or low temperature epitaxy, molecular beam epitaxy, or other suitable process. Hence, the variation in $\sigma V_T$, for a transistor manufactured at a 35 nm or finer process that would otherwise be in the range of 50-100 mV, is reduced to the range of 20-40 mV when the invention is implemented for the same dimension process. As a result, a basically standard bulk MOS manufacturing process may be employed with the invention disclosed herein and without the need to resort to complex solutions suggested by prior art technologies.

A person of ordinary skill in the art would appreciate that the self-aligned etching step that forms recess 910, shown in FIG. 2H, sacrifices any source extension ions or drain extension ions that may have diffused into the channel region. The positions of those ions reflect variations that arise from scattering events during ion implantation and/or from high temperature activation processes (900° C. or higher). The formation of recess 910 eliminates those variations. The use of any one of several low-temperature processes to reconstitute the channel minimizes the movement of the source extension and drain extension ions, substantially eliminating their contribution to RXF. The etching of the overlap portion of the extensions improves the electrostatic integrity, improves the on current and reduces the overlap capacitances.

Figure 3A:
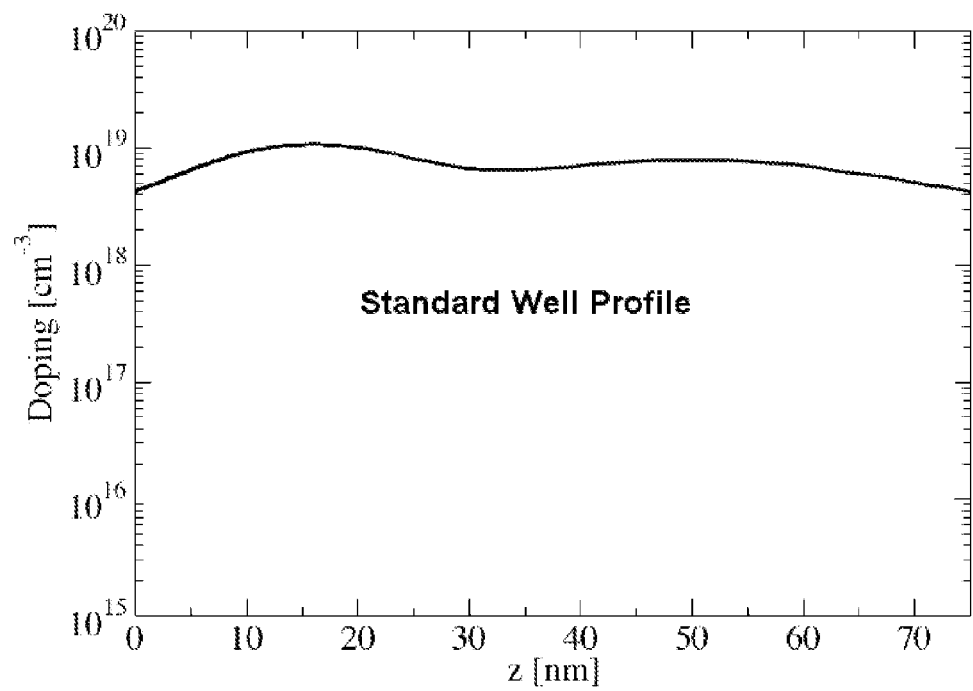
FIG. 3A is a diagram showing a conventional doping profile for short channel transistors.

According to an embodiment of the invention, low temperature, e.g., 300-750° C., epitaxy processes are used to form both layers 160 and 170 (FIG. 2I). While it is essential that the charge associated with the depletion of layer 160 is essentially planar, there are several alternative doping strategies and corresponding doping profiles that can support this requirement. These profiles are representatively shown in FIGS. 3B through 3E. In FIGS. 3A through 3E, the Z=0 point is at the interface between the high-K dielectric stack 180 and the epitaxial layer 170. The region from Z=0 to Z=10 nm represents the nominal thickness of the epitaxial layer 170, for reference, taken at the midpoint between the source and drain regions. FIG. 3A shows a channel doping profile that is representative of normal transistor construction. In standard processes, there are multiple implants forming the wells and channel regions of the transistors. The FIG. 3A profile is representative of the middle of the channel, with the combined effect of well implants, threshold voltage implants and pocket implants. The total well depth is typically 200 nm to 400 nm, but the FIG. 3 all show the 75 nm lying closest to the gate. In conventional CMOS technologies this region is normally highly doped with a shallow "threshold voltage" implant and pocket implants.

Figure 3B:
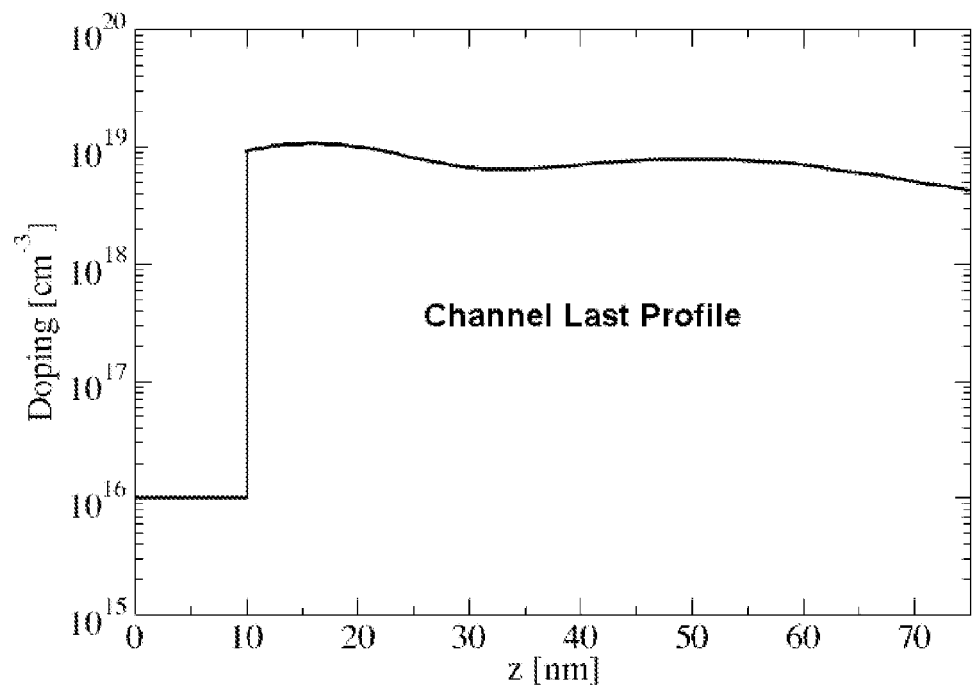
FIG. 3B is a diagram showing a doping profile realized in a channel-last process scheme according to an embodiment of the invention.
Figure 3C:
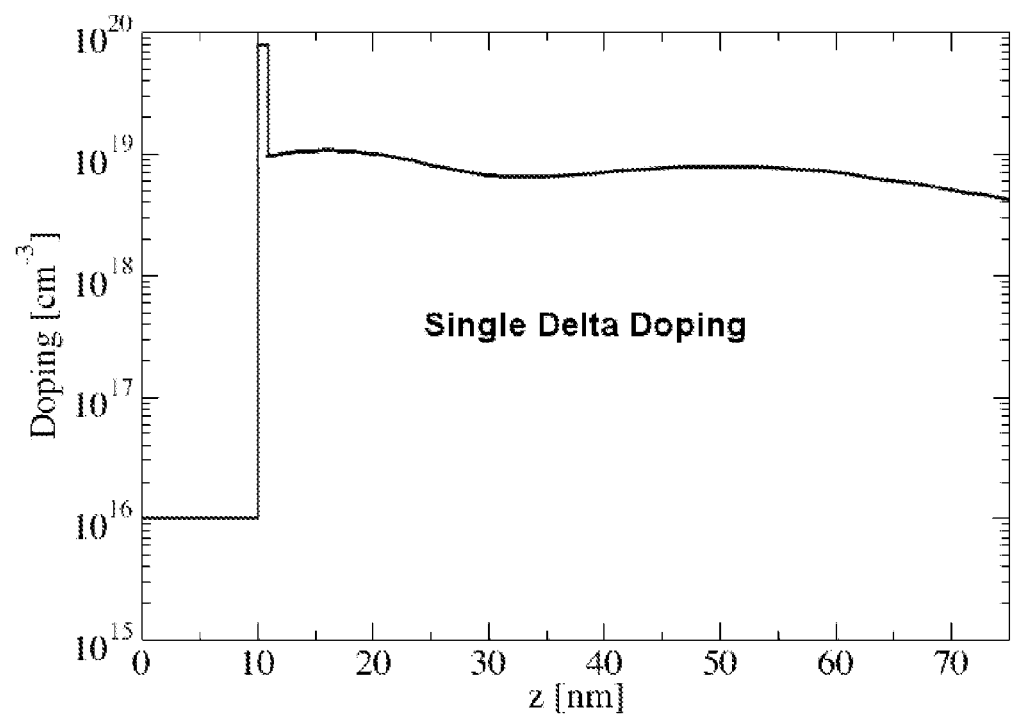
FIG. 3C is a diagram showing a delta doping profile for use in a channel-last process scheme according to an embodiment of the invention.
Figure 3D:
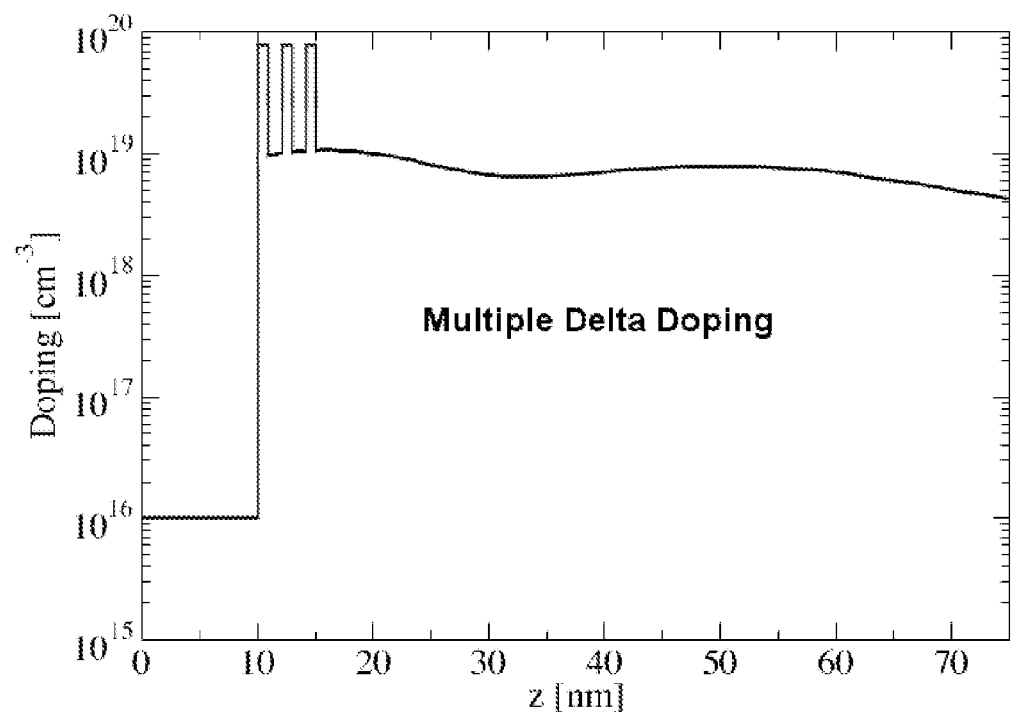
FIG. 3D is a diagram showing a multiplicity of delta doping profiles for use in a channel-last process scheme according to an embodiment of the invention.
Figure 3E:
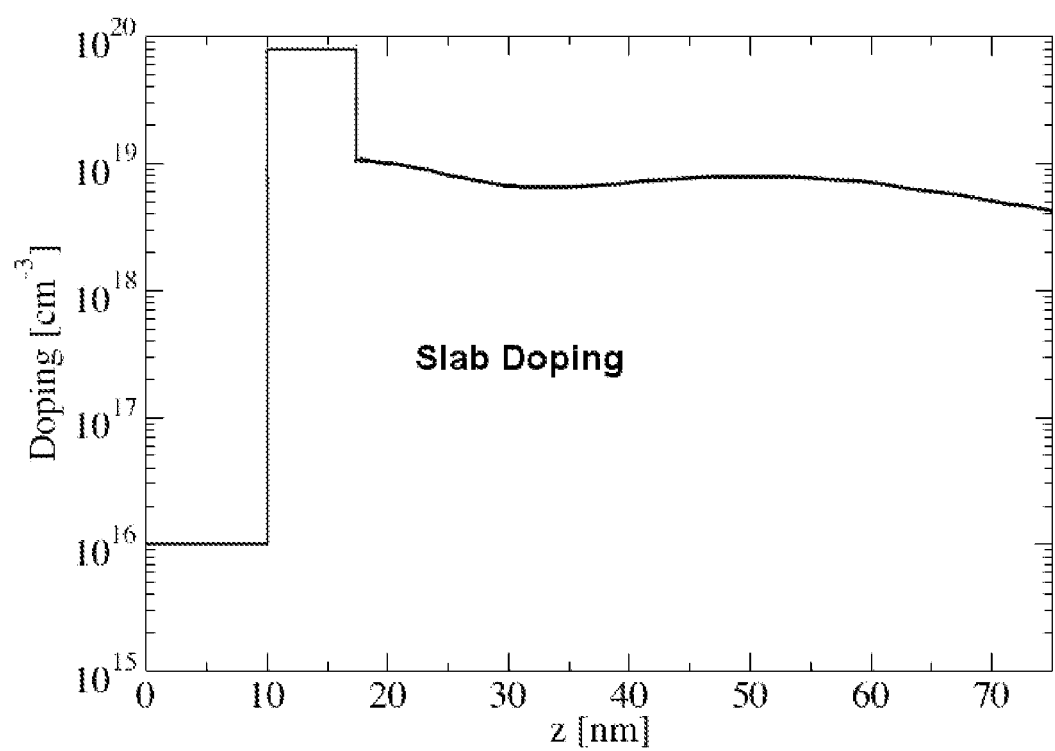
FIG. 3E is a diagram showing a slab doping profile, which might be realized either by low temperature, doped epitaxy or by atomic layer deposition of a thick doped layer, for use in a channel-last process scheme according to an embodiment of the invention.
Figure 4:
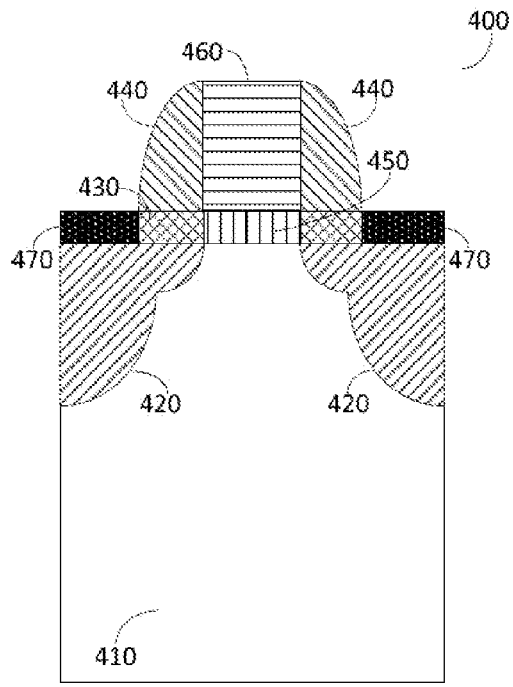
FIG. 4 is a schematic cross-section of a standard bulk MOSFET (prior art).
Figure 5:
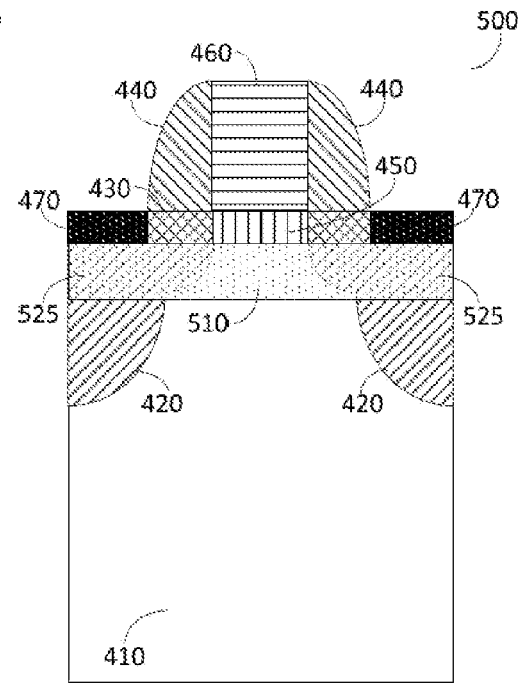
FIG. 5 is a schematic cross-section of an epitaxial channel MOSFET (prior art).

FIG. 3B shows the well profile of a simple 'channel last' structure, in which the highly doped region nearest to the gate has been etched away and replaced with a very low-doped, perhaps undoped epitaxial layer. In the other cases, layer 160 has an extremely high doping density, e.g., $10^{19}$ to $10^{21}$ ions/$cm^3$, which makes the formation of layer 160 especially critical. The first instance, illustrated by FIG. 3C shows a single "delta" doped layer, which approximates a monolayer of semiconductor with $10^{12}$ to $10^{13}$ doping ions/$cm^2$, which is equivalent to $10^{20}$ or $10^{21}$ doping ions per $cm^3$. Such a layer might be formed by low temperature epitaxy with in situ doping or by atomic layer deposition. In the intended operation of the device, the entire "delta" layer would be ionized, contributing to the definition of the target threshold voltage. FIG. 3C depicts a diagram of a delta doping profile as described by Asenov et al. in the paper "Suppression of Random Dopant-Induced Threshold Voltage Fluctuations in Sub-0.1-μm MOSFETs with Epitaxial and δ-Doped Channels," IEEE Transactions on Electron Devices, Vol. 46, No. 8, August 1999, Pages 1718-1724, however used according to the invention in the context of a channel-last process. FIG. 3D shows multiple "delta" doping layers, which might be required if the deposition process precludes full activation of enough doping ions in a single monolayer. In this case all the delta layers would be ionized, in order to set the proper threshold voltage. FIG. 3E shows an alternative in which layer 160 is very highly doped, but more or less uniformly through its thickness, which might be several nanometers. Again, this layer might be formed by low temperature epitaxy or atomic layer deposition. Except for the simple channel-last example in FIG. 3B, all these cases require very high peak doping densities, in the order of $10^{19}$ to $10^{21}$ or more active doping ions per $cm^3$ in layer 160.

The various profiles in FIGS. 3B through 3E differ in their sensitivity to substrate bias. The least sensitive structure is the pure "delta" doping as shown in FIG. 3C, and the most sensitive is the "slab" doping as illustrated in FIG. 3E. The other cases are intermediate.

Figure 2J:
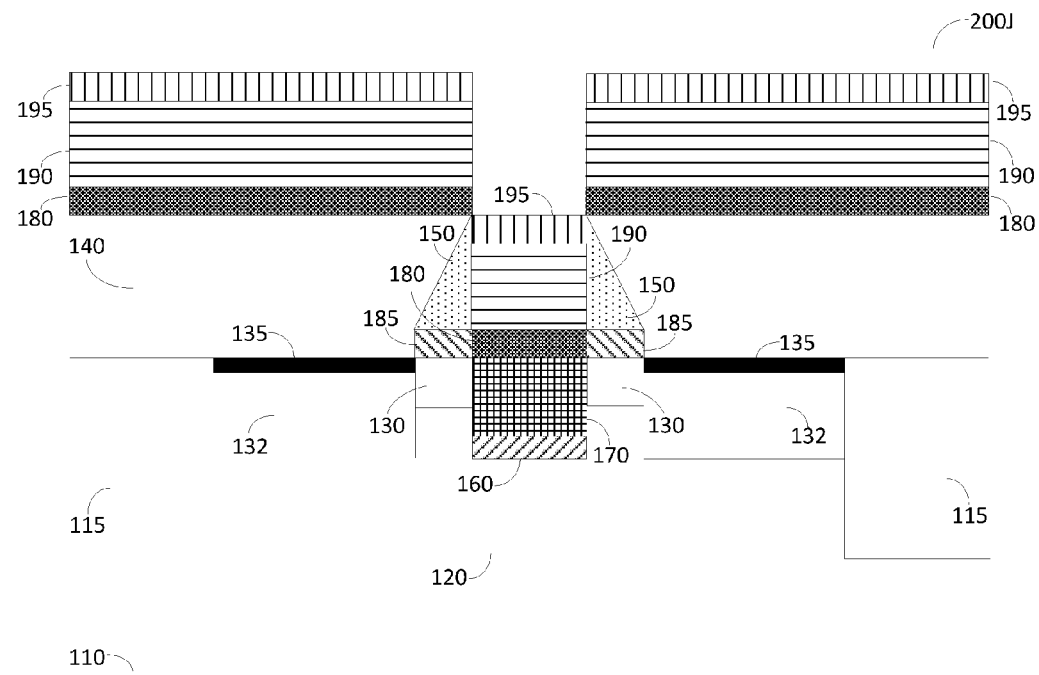
FIG. 2J is a schematic cross-section showing a high-K dielectric layer, a metal gate layer and an optional polysilicon cap formed within the cavity according to an embodiment of the invention.
Figure 2K:
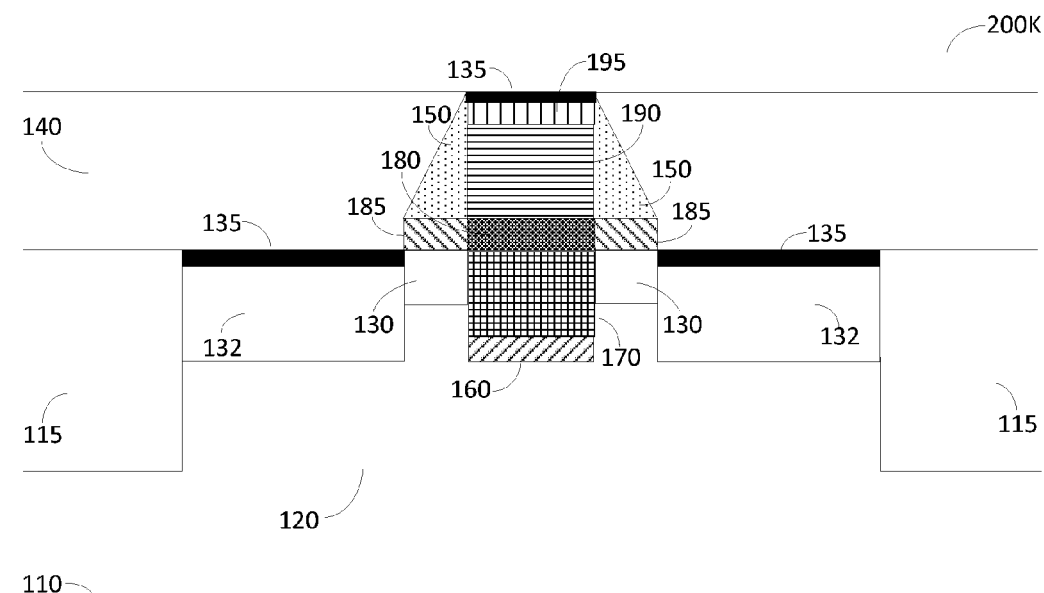
FIG. 2K is a schematic cross-section showing a MOSFET transistor having a gate formed according to an embodiment of the invention.

Following the steps of forming layers 160 and 170, and as shown in FIG. 2J, cross-section 200J, a high-K dielectric stack 180 is formed in the cavity 820 over the channel epitaxial layer 170. This stack may be expected to have an effective dielectric constant K in excess of 6. The high-K dielectric stack 180 consists of a thin layer of $SiO_2$, typically 1 nm or less, capped by a layer of high-K dielectric, usually incorporating an oxide or oxynitride of hafnium. All layers after the highly doped layer 160, if used, are formed using a low-temperature (not exceeding 900° C., preferably not exceeding 750° C., and more preferably, not exceeding 650° C.) deposition methods. If the present invention is used in an integrated circuit also containing transistors formed by other fabrication techniques, all layers after the highly doped layer 160, if used, should be formed after all high temperature operations for the entire integrated circuit have been performed so that the such layers are not heated to over 900° C., and more preferably 750° C. or 650° C. Thereafter the desired gate metal is deposited forming layer 190, where the gate metal is chosen primarily for its work function as well as for manufacturing considerations. Optionally, a manufacturing process may require a poly-silicon, or amorphous silicon, cap for protection. FIG. 2K shows cross-section 200K that depicts the structure after the removal of the excess high-K dielectric layer 180, metal layer 190 and poly layer 195, using for example CMP. Hereinafter processing may continue by, for example, adding a second dielectric layer (not shown) and thereafter continuing with additional processing steps including, but not limited to, forming metallization connectivity layers. For N and P type MOS transistors different types of metal gates are needed to incorporate work functions appropriate for the desired NMOS and PMOS threshold voltages.

Figure 6:
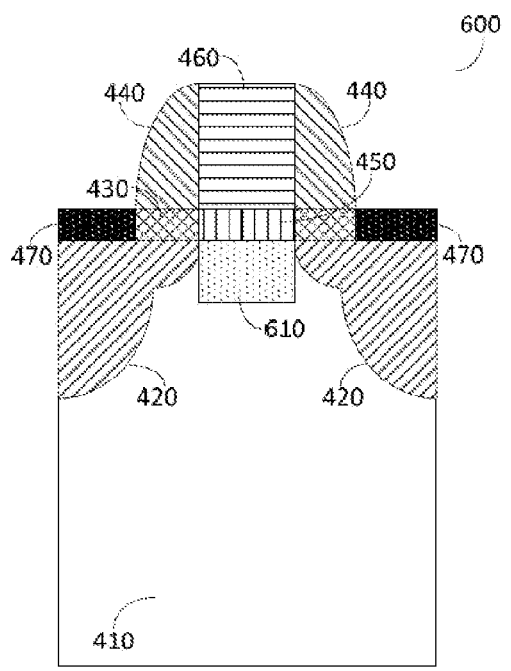
FIG. 6 is a schematic cross-section of a channel-last MOSFET according to an embodiment of the invention.
Figure 7:
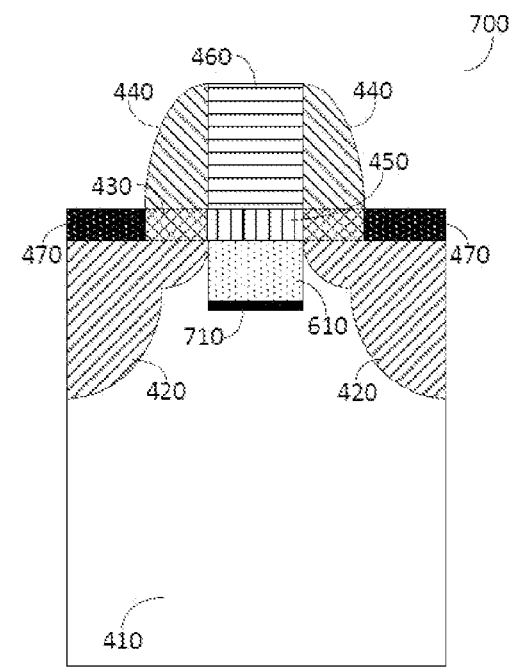
FIG. 7 is a schematic cross-section of a channel-last MOSFET further comprising a delta layer according to an embodiment of the invention.

FIG. 6 shows a schematic cross-section 600 of a channel-last MOSFET according to an embodiment of the invention. Accordingly, the channel region between the source and drain areas 420 is removed by selective etching between the spacers 440 forming a cavity penetrating into the well area 410, and as further explained hereinabove. Selective epitaxial growth is carried out to create a low-doped channel region 610. A high-K dielectric region 450 forms the gate insulator over which the gate material 460 is formed. FIG. 7 shows a schematic cross-section 700 of a channel-last MOSFET according to another embodiment of the invention. Accordingly, the channel region is removed by selective etching between the spaces created by the spacers 440, as explained in further detail hereinabove. A layer 710 that is highly doped, for example, an epitaxial δ-layer as discussed hereinabove, is first formed in the channel region after which a selective epitaxial growth is carried out to create a low-doped channel region 610 before the channel is sealed with a high-K dielectric insulator layer 450 and the gate material 460.

Hence it should be understood by those of ordinary skill in the art that an embodiment of the "channel-last" process comprises of the building of the MOSFET's channel in a recess of a cavity etched into the well area between a drain area and a source area of the MOSFET. The channel may comprise an un-doped or lightly doped epitaxial layer that is grown in the recess of the cavity. In one embodiment of the invention prior to growing the un-doped or lightly doped epitaxial layer, an initial layer is formed in the recess of the cavity that is a single or multi-delta layer or a slab doped area. Once the channel is created according to the principles of the invention the process is completed similarly to the "gate-last" like processes.

The invention disclosed herein describes a general well which may be an N-well or a P-well, and hence suitable for a channel of a PMOS or NMOS transistor respectively. Further, the electrostatic characteristics of partially depleted SOI (silicon-on-insulator) transistors are sufficiently similar to bulk semiconductors that all the techniques described in this invention are equally applicable to partially depleted SOI devices. A person of ordinary skill-in-the-art would readily understand that the invention can be adapted for use in a plurality of ways, including integrated circuits where all transistors or a portion thereof are manufactured using the techniques disclosed hereinabove. Furthermore, although the invention is described herein with reference to the preferred embodiment, one skilled-in-the-art will readily appreciate that other applications may be substituted for those set forth herein without departing from the spirit and scope of the present invention. Accordingly, the invention should only be limited by the Claims included below.

What is claimed is:

1. A method for manufacturing a metal-oxide-semiconductor field effect transistor (MOSFET) comprising:
    forming a well region of a first conductivity type in a substrate;
    forming a silicon oxide layer over at least a portion of the well region;
    forming a poly gate over the silicon oxide, the poly gate extend defining a first region in the well;
    forming a source region of a second conductivity type and a drain region of the second conductivity type, the source region being formed in a second portion of the well region and having a shallow portion thereof that is adjacent to the first region, the drain region being formed in a third portion of the well region and having a shallow portion thereof that is adjacent the first region and separate from the second region;
    forming spacers on the silicon oxide at the sides of the poly gate and over at least a portion of the shallow region of the source and the shallow region of the drain;
    processing the drain region and the source region not covered by the spacers to establish a desired level of high conductivity;
    forming a first interlayer dielectric over at least the first region, the second region and the third region;
    polishing the interlayer dielectric to expose a top surface of the poly gate;
    sacrificing the poly gate to form a cavity between the spacers;
    clearing the part of the silicon oxide within the cavity;
    etching selectively a recess into the well within the cavity, the recess having a bottom surface that is deeper than the depth of the shallow source region and the shallow drain region;
    forming an undoped channel epitaxial layer in the recess, the undoped channel epitaxial layer having a thickness that reduces statistical variations of threshold voltage ($\sigma V_T$) of the MOSFET;
    forming a high-K dielectric stack over the undoped channel epitaxial layer; and
    forming a metal gate layer over the high-K dielectric layer;
    the forming of the undoped channel epitaxial layer, the forming the high-K dielectric stack and the forming the metal gate layer all using processes that do not exceed 900° C.

2. The method of claim 1, wherein forming the undoped channel epitaxial layer, the forming the high-K dielectric stack and the forming the metal gate layer all use processes that do not exceed 750° C.

3. The method of claim 1, wherein the MOSFET is part of an integrated circuit having other transistors, and wherein after forming the undoped channel epitaxial layer, forming the high-K dielectric stack, and forming the metal gate layer the method further comprising:

using processing steps for processing the integrated circuit that do not raise the temperature of the integrated circuit above 750° C.

4. The method of claim 1, wherein the first conductivity type is one of: negative (N-type), positive (P-type).

5. The method of claim 1, wherein etching selectively a recess into the well further comprises:

removing of between 5 nanometers to 25 nanometers of the well material within the cavity.

6. The method of claim 1, wherein forming the undoped channel epitaxial layer comprises using one of: atomic layer deposition, low-temperature epitaxy, molecular beam epitaxy.

7. The method of claim 1, wherein the undoped channel epitaxial layer thickness is between 1 nanometer and 25 nanometers.

8. The method of claim 1 further comprising:

after etching selectively a recess into the well within the cavity and before forming the undoped channel epitaxial layer in the cavity, forming a buried epitaxial layer in the cavity with a greater doping level than that of the undoped channel epitaxial layer.

9. The method of claim 8, wherein the buried epitaxial layer thickness is between 0.3 nanometers and 15 nanometers.

10. The method of claim 8, wherein the buried epitaxial layer has an ion doping of the first type with a density between $10^{12}$ and $10^{13}$ ions per square centimeter and having a Dirac delta distribution in depth.

11. The method of claim 8, wherein the buried epitaxial layer has an ion doping of the first type substantially in a plurality of single planes wherein the doping density profile of each single plane is a Dirac delta distribution in corresponding depths.

12. The method of claim 8, wherein the buried epitaxial layer is a slab with a doping of the first type in the buried epitaxial layer and having a density between $10^{19}$ and $10^{21}$ doping ions per cubic centimeter.

13. A method of manufacture for a metal-oxide semiconductor field effect transistor (MOSFET), the method comprising:

forming a poly gate over a well and using the poly gate as a mask for forming a shallow source region and a shallow drain region;
forming spacers on the sides of the poly gate;
sacrificing the poly gate to form a cavity between spacers;
etching away any protective oxide within the cavity;
etching selectively a recess into the well within the cavity, the recess having a bottom surface that is deeper than the depth of the shallow source region and the shallow drain region;
forming in the recess a buried epitaxial layer having a first doping level and a first layer thickness;
forming in the recess an undoped channel epitaxial layer over the buried epitaxial layer and having a second doping level and a second layer thickness, the undoped channel epitaxial layer having a thickness that reduces statistical variations of threshold voltage ($\sigma V_T$) of the MOSFET, the undoped channel epitaxial layer touching the shallow source region and the shallow drain region;
forming a high-K dielectric stack over the undoped channel epitaxial layer; and
forming a metal gate layer over the high-K dielectric layer;

the forming of the undoped channel epitaxial layer, the forming the high-K dielectric stack and the forming the metal gate layer all using processes that do not exceed 900° C.

14. The method of claim 13, wherein etching selectively a recess into the well further comprises:

removing of between 5 nanometers and 25 nanometers of the well material within the cavity.

15. The method of claim 13, wherein forming each epitaxial layer comprises using one of: atomic layer deposition, low-temperature epitaxy, molecular beam epitaxy.

16. The method of claim 13, wherein the first layer thickness is 0.3 nanometers and 15 nanometers.

17. The method of claim 13, wherein the buried epitaxial layer has an ion doping of the first conductivity type with a density between $10^{12}$ and $10^{13}$ ions per square centimeter, distributed as one of: a Dirac delta distribution in a single plane, a Dirac delta distribution in each of a plurality of planes.

18. The method of claim 13, wherein the buried epitaxial layer has a doping of the first conductivity type with a density of between $10^{19}$ and $10^{21}$ doping ions per cubic centimeter.

19. The method of claim 13, wherein the undoped channel epitaxial layer has an ion doping density between zero and $10^{17}$ doping ions per cubic centimeter and wherein the undoped channel epitaxial layer thickness is between 1 nanometer and 25 nanometers.

20. A method for manufacturing a metal-oxide-semiconductor field effect transistor (MOSFET) comprising:

etching selectively a recess into a well of a MOSFET between a shallow drain region and a shallow source region within a cavity formed between spacers of a sacrificial gate, the recess having a bottom surface that is deeper than the depth of the shallow source region and the shallow drain region; and
forming an undoped channel epitaxial layer in the recess, the undoped channel epitaxial layer having a thickness that reduces statistical variations of threshold voltage ($\sigma V_T$) of the MOSFET;
forming a high-K dielectric stack over the undoped channel epitaxial layer; and
forming a metal gate layer over the high-K dielectric layer;
the forming of the undoped channel epitaxial layer, the forming the high-K dielectric stack and the forming the metal gate layer all using processes that do not exceed 900° C.

21. The method of claim 1, wherein forming the undoped channel epitaxial layer, the forming the high-K dielectric stack and the forming the metal gate layer all use processes that do not exceed 650° C.

22. The method of claim 13, wherein forming the undoped channel epitaxial layer, the forming the high-K dielectric stack and the forming the metal gate layer all use processes that do not exceed 750° C.

23. The method of claim 13, wherein forming the undoped channel epitaxial layer, the forming the high-K dielectric stack and the forming the metal gate layer all use processes that do not exceed 650° C.

24. The method of claim 20, wherein forming the undoped channel epitaxial layer, the forming the high-K dielectric stack and the forming the metal gate layer all use processes that do not exceed 750° C.

25. The method of claim 20, wherein forming the undoped channel epitaxial layer, the forming the high-K dielectric stack and the forming the metal gate layer all use processes that do not exceed 650° C.

* * * * *